United States Patent
Lin

(10) Patent No.: US 6,660,629 B2
(45) Date of Patent: Dec. 9, 2003

(54) CHEMICAL MECHANICAL POLISHING METHOD FOR FABRICATING COPPER DAMASCENE STRUCTURE

(75) Inventor: Bih-Tiao Lin, Ping-Tung Hsien (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 10/077,276

(22) Filed: Feb. 14, 2002

(65) Prior Publication Data

US 2002/0098675 A1 Jul. 25, 2002

Related U.S. Application Data

(63) Continuation of application No. 09/546,423, filed on Apr. 10, 2000.

(30) Foreign Application Priority Data

Mar. 16, 2000 (TW) ........................................ 89104797 A

(51) Int. Cl.[7] .......................................... H01L 21/4763
(52) U.S. Cl. ...................... 438/634; 438/626; 438/627; 438/628; 438/629; 438/634
(58) Field of Search ................................ 438/597, 618, 438/620, 622, 626, 627, 628, 629, 639, 643, 644, 645, 648, 672, 675, 678, 679, 680, 687

(56) References Cited

U.S. PATENT DOCUMENTS 6,001,730 A * 12/1999 Farkas et al. ................ 438/627
6,103,625 A * 8/2000 Marcyk et al. ............. 438/691
6,150,269 A * 11/2000 Roy .......................... 438/687
6,171,957 B1 * 1/2001 Maekawa ................... 438/672
6,258,711 B1 * 7/2001 Laursen ...................... 438/633
2002/0016066 A1 * 2/2002 Birang et al. .............. 438/689

* cited by examiner

Primary Examiner—George Fourson
Assistant Examiner—Julio J. Maldonado
(74) Attorney, Agent, or Firm—J.C. Patents

(57) ABSTRACT

A method of fabricating a copper damascene. The method is applicable to a substrate, which substrate has a dielectric layer formed thereon. The method comprising forming a damascene opening in the dielectric layer, forming a barrier layer which conforms to a profile of the damascene opening over the substrate, and forming a conformal copper seeding layer on the barrier layer. A copper layer is then formed on the copper seeding layer, wherein the copper seeding layer has a thickness that is sufficient to fill the damascene opening, followed by forming a conformal protective layer on the copper layer. A first CMP step is performed to remove the protective layer, while a portion of the copper layer outside the damascene opening is removed until the protective layer is completely removed, wherein a first polishing rate is faster than a second polishing rate. A second CMP step is further performed to remove portions of the copper layer, the copper seeding layer, and the barrier layer outside the damascene opening, so as to form a copper damascene. A third polishing rate for the copper layer is provided in the second CMP step, wherein the third polishing rate is slower than the first polishing rate.

9 Claims, 3 Drawing Sheets

CHEMICAL MECHANICAL POLISHING METHOD FOR FABRICATING COPPER DAMASCENE STRUCTURE

CROSS-REFERENCE TO RELATED APPLICATION

This application is a continuation application of, and claims the priority benefit of, U.S. application serial No. 09/546,423 filed on Apr. 10, 2000.

BACKGROUND OF THE INVENTION

1. Field of Invention

The present invention relates to a method of fabricating a multi-level metal interconnect for a semiconductor device. Particularly, the invention relates to a method of fabricating a copper damascene.

2. Description of Related Art

When an integrated circuit (IC) has gradually increased its integration, with a reduction of a width of metal line, a conventional aluminum interconnect increases its resistance as a result, while a denser distribution of electrical current usually leads to a more serious electro-migration. As the resistance of the metal interconnect increases, the device suffers from an increase in RC time delay and an increase in capacitance between the metal interconnects. Therefore, the operation speed of the device is reduced. The electro-migration causes a short circuit in the aluminum interconnect. Therefore, copper that has a lower resistance and exhibits a lower electro-migration, has become a unique choice for all semiconductor manufacturers. In addition, the copper interconnect can approximately double the operation speed of the device when comparing with the aluminum interconnect.

Since copper itself is not easily etched by a conventional etching gas, the fabrication of the copper interconnect can not be accomplished by the conventional etching method, but is achieved by a damascene technique. The damascene technique involves forming an opening for a metal interconnect, such as a damascene opening in a dielectric layer, followed by filling the damascene opening with metal so as to achieve the metal interconnect technique. FIGS. 1A through 1C are schematic diagrams illustrating a conventional fabrication process of the copper damascene.

Referring to FIG. 1A, a substrate 100 is provided with devices and conductive lines formed thereon. A dielectric layer 110 is formed on the substrate 100, followed by forming a damascene opening 120 in the dielectric layer 110, wherein the damascene opening 120 exposes the devices and conductive lines which serve as electrical connects. A conformal barrier layer 130 and a copper seeding layer 140 are then formed in sequence on the substrate 100. The damascene opening 120 is a dual damascene opening comprising a via hole and a trench for forming a plug and a conductive line, respectively. The via hole represents a narrow portion of the damascene opening 120, while the trench represents a wide portion of the damascene opening 120. The copper seeding layer 140 is formed to improve a quality of the copper layer in the subsequent process.

Referring to FIG. 1B, a copper layer 150 is formed on the copper seeding layer 140, wherein the copper layer 150 is thick enough to fill the damascene opening 120.

Referring to FIG. 1C, a chemical mechanical polishing (CMP) step is performed to remove portions of the copper layer 150, copper seeding layer 140, and the barrier layer 130 outside the damascene opening 120. As a result, a copper damascene 150a, such as copper dual damascene is formed, including a copper plug that is represented by a narrow portion of the copper damascene 150a and a copper line that is represented by a wide portion of the copper damascene 150a.

However, the conventional fabrication method for a copper damascene produces a dishing issue for the copper damascene, as shown in FIG. 1C. As copper is a soft material, a serious dishing occurs on the surface of the copper damascene 150a, when the CMP step is performed to form the copper damascene having a large area. For example, in a 0.8–1 micron copper damascene process, a dishing with a size of greater than 0.1 micron can occur on the surface of the copper damascene 150a. It has been known that such dishing can reduce a planarity of the substrate. Thus, this negatively affects the lithographic process for each metal interconnect in the subsequent process.

SUMMARY OF THE INVENTION

The invention provides a method of fabricating a copper damascene, which method improves a dishing issue encountered in the conventional fabrication method for the copper damascene.

The method of fabricating the copper damascene is applicable to a substrate, which substrate has a dielectric layer formed thereon. The method comprising forming a damascene opening in the dielectric layer, forming a barrier layer which conforms to a profile of the damascene opening over the substrate, and forming a conformal copper seeding layer on the barrier layer. A copper layer is then formed on the copper seeding layer, wherein the copper seeding layer is thick enough so that the damascene opening is filled, followed by forming a conformal protective layer on the copper layer. A first chemical mechanical polishing (CMP) step is performed to remove the protective layer, while a portion of the copper layer outside the damascene opening is removed until the protective layer is completely removed. The first CMP step includes a first polishing rate for the copper layer and a second polishing rate for the protective layer, wherein the first polishing rate is faster than the second polishing rate. A second CMP step is further performed to remove portions of the copper layer, the copper seeding layer, and the barrier layer outside the damascene opening, so as to form a copper damascene. A third polishing rate for the copper layer is provided in the second CMP step, wherein the third polishing rate is slower than the first polishing rate.

As embodied and broadly described herein, the invention provides a fabrication method for the copper damascene. Since the protective layer is conformal to the profile of the damascene opening in the dielectric layer, a portion of the protective layer in the damascene opening is lower than a remaining portion of the protective layer outside thereof. Accordingly, as a polishing step for the portion of protective layer in the damascene opening begins to take place, the polishing step for the remaining portion of the protective layer has long been completed, with a portion of the copper layer thereunder being removed in the first CMP step. Also, the polishing rate for the copper layer is faster than that of the protective layer in the first CMP step, so a portion of the copper layer in the damascene opening is higher than a remaining portion of the copper layer outside thereof after removal of the protective layer. Therefore, the portion of the copper layer in the damascene opening provides a dummy portion to resolve a problem created by a faster polishing rate. As a result, the copper damascene having a planar surface is yielded. Furthermore, the polishing rate for the copper layer is reduced in the second CMP step, so an amount of the copper layer being polished is accurately controlled to prevent a dishing issue due to an over-polishing on the copper damascene.

According to the fabrication method for the copper damascene of the invention, the protective layer having the smaller polishing rate serves as a buffer layer, so as to delay a time for polishing the copper layer in the damascene opening. Therefore, this solves the problem produced by a fast polishing rate, and yields the copper damascene having a planar surface. In addition, the polishing rate for the copper layer is reduced in the second CMP step, so the dishing issue due to the over-polishing on the copper damascene is prevented.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Description of the fabrication method for the copper damascene is made as follows, with reference to FIGS. 2A–2F.

Figure 1A:
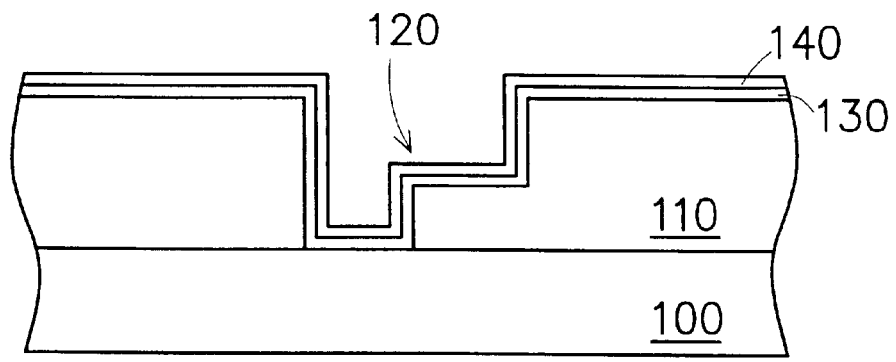
FIGS. 1A through 1C are schematic diagrams illustrating a conventional fabrication process for a copper damascene.
Figure 1B:
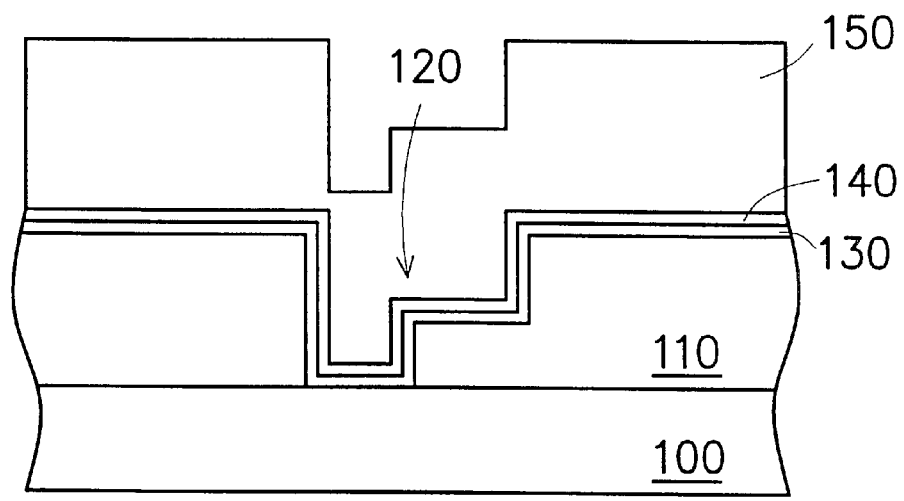
Figure 1C:
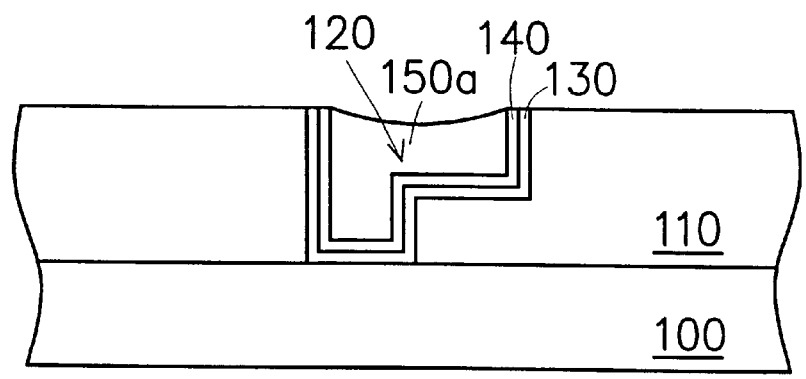
Figure 2A:
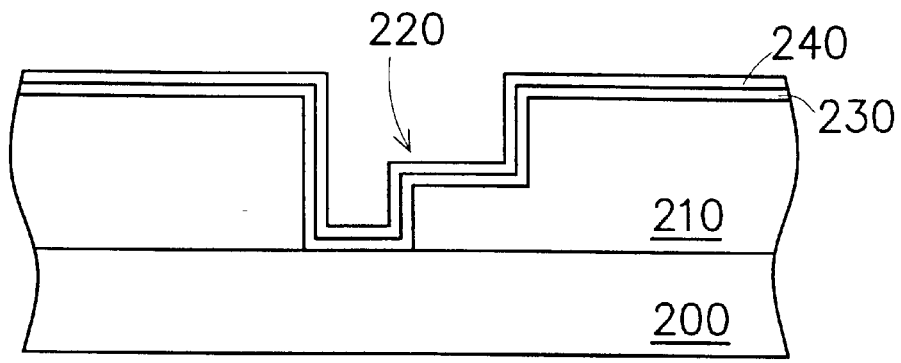
FIGS. 2A through 2F are schematic diagrams illustrating a fabrication process for a copper damascene according to one preferred embodiment of this invention.

Referring to FIG. 2A, a substrate 200 is provided with a dielectric layer 210 formed thereon. A damascene opening 220 is formed in the dielectric layer 210, followed by forming a barrier layer 230 which conforms to a profile of the damascene opening 220 over the substrate 200. The barrier layer 230 is made of materials which can prevent a copper diffusion through the dielectric layer 210, and preferably including tantalum (Ta), tantalum nitride (TaN), tungsten nitride (WN), or Ta/TaN. The method of forming the barrier layer 230 includes physical vapor deposition (PVD). A copper seeding layer 240 is then formed on the barrier layer 230 in order to improve a quality of a copper layer that is formed subsequently.

Although the damascene opening shown in FIG. 2A is a dual damascene opening comprising a via hole (a narrow part of the damascene opening 220) and a trench (a wide part of the damascene opening 220), the damascene opening can merely be a via hole or a trench.

Figure 2B:
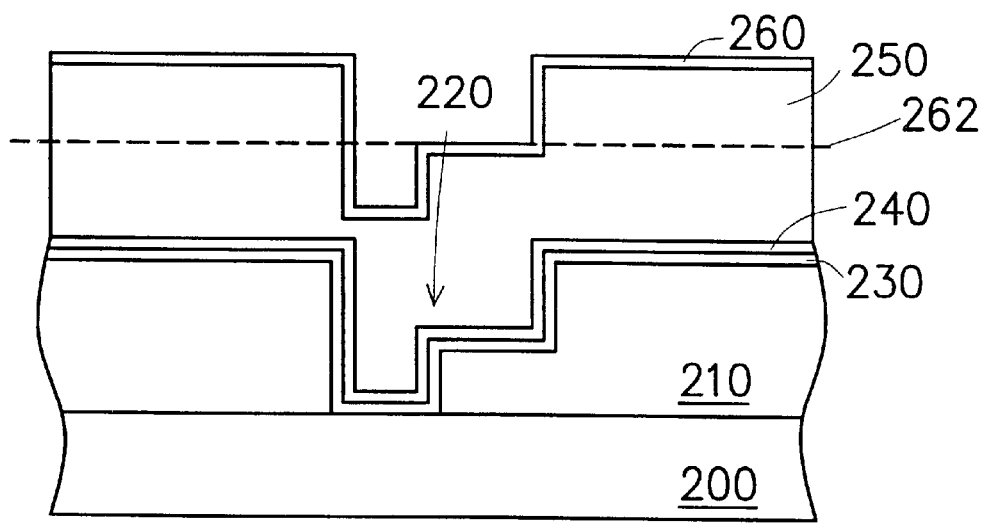

Referring to FIG. 2B, a copper layer 250 is formed on the copper seeding layer 240, wherein the copper layer 250 is thick enough so that the damascene opening is filled. The method for forming the copper layer 250 includes methods, such as electroplating, PVD, chemical vapor deposition (CVD), and so on. A protective layer 260 is formed on the copper layer 250, wherein the protective layer 260 preferably includes materials such as titanium nitride (TiN), TaN, W, WN, or cobalt (Co). The method for forming the protective layer 260 includes PVD, which forms the protective layer having a preferred thickness of about 50–500 angstroms.

A first chemical mechanical polishing (CMP) step is performed, by which method provides a polishing rate for the copper layer 250 which is faster than that for the protective layer 260. For instance, when the protective layer 260 is made of TiN, TaN, W, WN, or Co as mentioned above, the polishing step is performed using a Shibaura CHS2000 slurry, made of $Al_2O_3$ and $H_2O_2$ as main ingredients. In addition, the polishing step is performed under a pressure of about 300–400 g/cm$^2$.

Figure 2C:
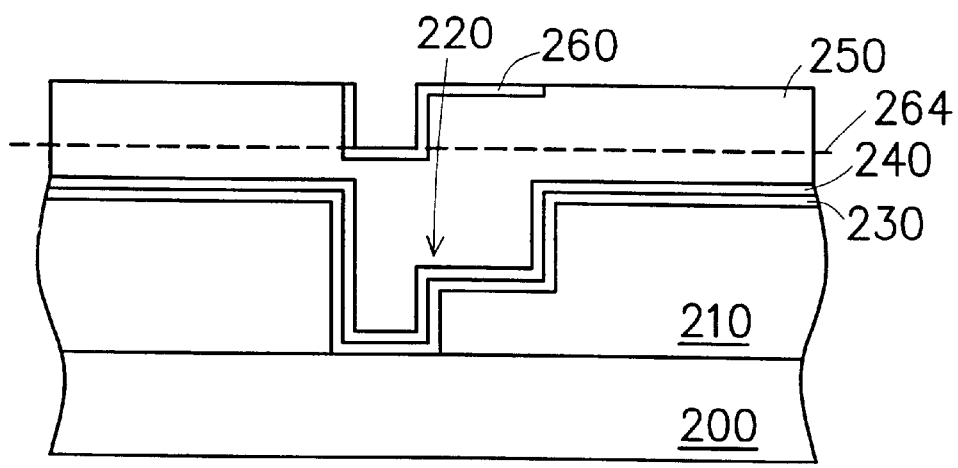
Figure 2D:
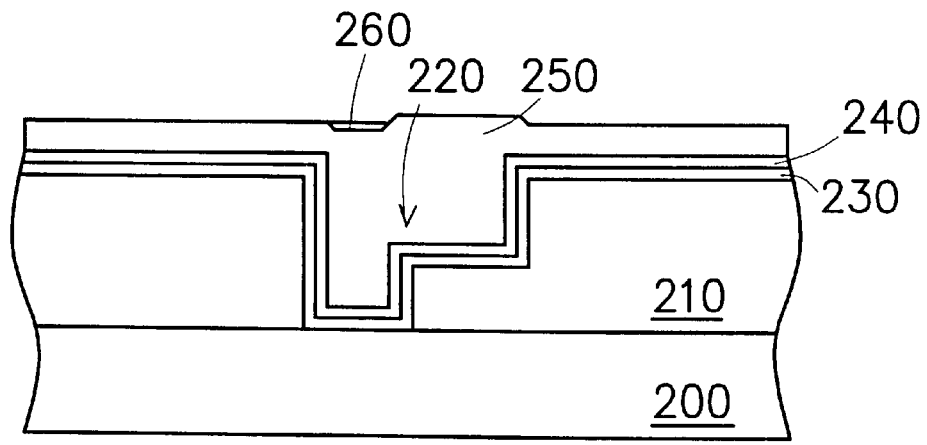
Figure 2E:
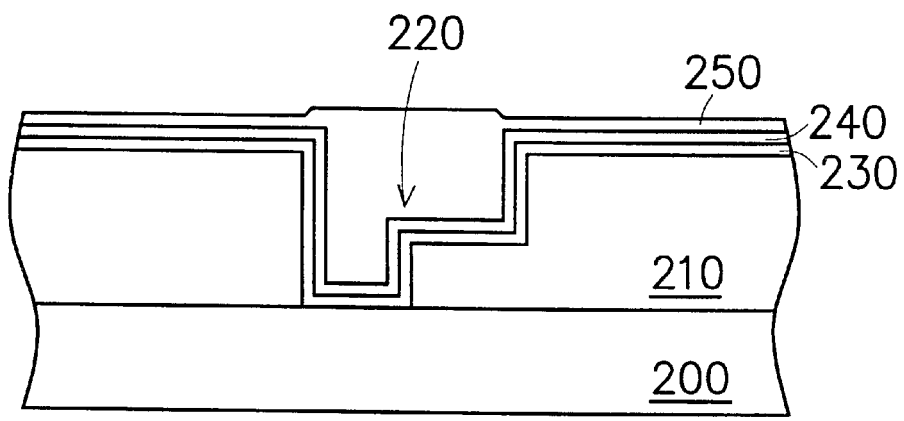

Referring to FIGS. 2C through 2E, which illustrate changes of the copper layer 250 and the protective layer 260 that occur at different stages in the CMP step. Particularly, FIG. 2C illustrates a diagram from FIG. 2B after portions of the copper layer 250 and the protective layer 260 above a dotted line 262 are removed. FIG. 2D illustrates a diagram from FIG. 2C after portions of the copper layer 250 above a dotted line 264 and outside the damascene opening 220 are removed, while FIG. 2E illustrates a diagram from FIG. 2D after a complete removal of the protective layer 260.

As shown in FIG. 2D and FIG. 2E, the protective layer 260 provides a slower polishing rate, so as to delay a time for polishing the protective layer 260. And after the protective layer 260 is completely removed, portions of the copper layer 250 in the damascene opening 220 are higher than other portions of the copper layer 250, as shown in FIG. 2E.

Figure 2F:
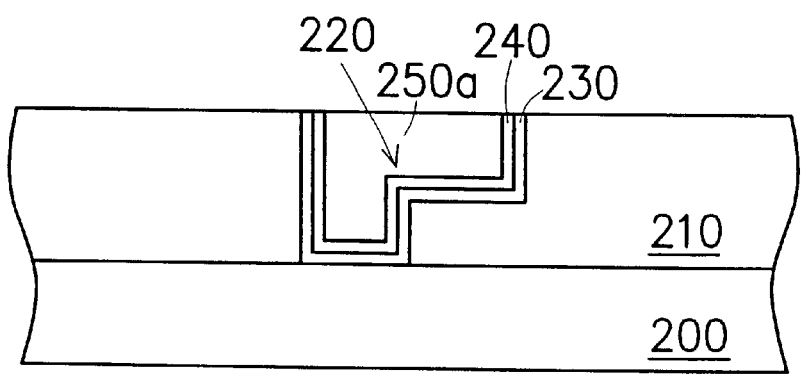

Referring to FIG. 2F, a second CMP step is performed to remove portions of the copper layer 250, the copper seeding layer 240, the barrier layer 230 outside the damascene opening 220, so as to form a copper damascene 250a. The copper damascene 250a is in this case a dual copper damascene comprising a copper plug and a copper line.

In order to control an amount being polished and to prevent a dishing issue due to an over-polishing on the copper damascene 250a, the second CMP step is performed using a Shibaura CHS600 slurry, made of $Al_2O_3$ and $H_2O_2$ as main ingredients. As a result, a polishing rate for the copper layer 250 is slower than the polishing for the copper layer 250 in the first CMP step.

However, it is preferable to have a same polishing rate for the barrier layer 230 and the copper layer 250, so that no dishing occurs on a surface of the copper damascene 250a after the barrier layer 230 is completely removed by polishing. For example, when the barrier layer 230 is made of materials, such as Ta, TaN, WN, or Ta/TaN, the Shibaura CHS600 slurry can be mixed with the Shibaura CHS2000 slurry to make a polishing rate same for the barrier layer 230 and the copper layer 250. The reason for mixing two types of slurry above is detailed below.

It was known that a pure Shibaura CHS600 slurry provides a faster polishing rate for Ta, TaN, WN, or Ta/TaN than that for the copper layer 250, and vice versa in case a pure Shibaura CHS2000 slurry is used. Therefore, a mixture of the Shibaura CHS600 slurry and the Shibaura CHS2000 slurry in a appropriate ratio is used to perform the polishing step, whereby achieving a same polishing rate for the barrier layer 230 and the copper layer 250.

According to the fabrication method for the copper damascene as described in the preferred embodiment of the invention, the protective layer 260 is approximately conformal to a profile of the dielectric layer 210 having the damascene opening 220. Therefore, the portion of the protective layer 260 in the damascene opening is lower than the rest of the protective layer 260. When a polishing step for the portion of protective layer 260 in the damascene opening 220 begins to take place, the polishing step for the rest of the protective layer 260 has long been completed, with a portion of the copper layer 250 thereunder being removed in the first CMP step. Also, the polishing rate for the copper layer 250 is faster than that of the protective layer 260 in the first CMP step, so a portion of the copper layer 250 in the damascene opening 220 is higher than a remaining portion of the copper layer 250 outside thereof after removal of the protective layer 260. Therefore, the portion of the copper layer 250 in the damascene opening 220 provides a dummy portion to resolve a problem created by a faster polishing rate. As a result, the copper damascene 250a having a planar surface is yielded.

Furthermore, the polishing rate for the copper layer 250 is reduced in the second CMP step, so an amount of the copper layer 250 being polished is accurately controlled to prevent a dishing issue due to an over-polishing of the copper damascene 250a. In addition, if the same polishing rate for the copper layer 250 and the barrier layer 230 is provided, the dishing issue does not occur on the copper damascene 250a when the barrier layer 230 is removed.

Summarizing from above, the invention provides a fabrication method for the copper damascene, by which method provides a protective layer having the smaller polishing rate to serve as a buffer layer, so as to delay a time for polishing the copper layer in the damascene opening. Therefore, this solves the problem produced by a fast polishing rate, and yields the copper damascene having a planar surface. In addition, the polishing rate for the copper layer is reduced in the second CMP step, so a dishing issue due to an over-polishing of the copper damascene is prevented.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A fabrication method for a copper damascene, applicable to a substrate having a dielectric layer formed thereon, the method comprising:

forming a damascene opening in the dielectric layer;

forming a barrier layer conformal to a profile of the damascene opening over the substrate;

forming a copper seeding layer on the barrier layer;

forming a copper layer on the copper seeding layer, wherein the copper layer is thick enough so that the damascene opening is filled;

forming a protective layer on the copper layer;

performing a first chemical mechanical polishing (CMP) step, so as to remove the protective layer and a portion of the copper layer outside the damascene opening, wherein a polishing rate for the copper layer is a first polishing rate, a polishing rate for the protective layer is a second polishing rate, and the first polishing rate is faster than the second polishing rate; and performing a second CMP step, so as to remove portions of the copper layer, the copper seeding layer, and the barrier layer outside the damascene opening, whereby a copper damascene is formed, wherein a polishing rate for the copper layer is a third polishing rate, a polishing rate for the barrier layer is a fourth polishing rate, the third polishing rate being slower than the first polishing rate, and the third polishing rate being the same as the fourth polishing rate.

2. The fabrication method of claim 1, wherein the damascene opening includes a dual damascene opening.

3. The fabrication method of claim 1, wherein the method for forming copper layer includes electroplating, PVD, and CVD.

4. The fabrication method of claim 1, wherein the method for forming copper seeding layer includes PVD.

5. The fabrication method of claim 1, wherein the protective layer includes tantalum, tantalum nitride, tungsten nitride, or cobalt.

6. The fabrication method of claim 1, wherein the method for forming the protective layer includes PVD.

7. The fabrication method of claim 1, wherein the barrier layer includes tantalum, tantalum nitride, tungsten nitride, or tantalum/tantalum nitride.

8. The fabrication method of claim 1, wherein the protective layer has a thickness of about 50–500 angstroms.

9. The fabrication method of claim 1, wherein the first CMP step and the second CMP step are performed under a pressure of about 300–400 $g/cm^2$.

* * * * *